United States Patent
Yang

(10) Patent No.: US 11,264,278 B1
(45) Date of Patent: Mar. 1, 2022

(54) TRANSISTOR WITH REDUCED GATE RESISTANCE AND IMPROVED PROCESS MARGIN OF FORMING SELF-ALIGNED CONTACT

(71) Applicant: NANYA TECHNOLOGY CORPORATION, New Taipei (TW)

(72) Inventor: Sheng-Hui Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/990,642

(22) Filed: Aug. 11, 2020

(51) Int. Cl.
| | |
|---|---|
| *H01L 21/768* | (2006.01) |
| *H01L 29/66* | (2006.01) |
| *H01L 29/06* | (2006.01) |
| *H01L 29/423* | (2006.01) |
| *H01L 29/417* | (2006.01) |
| *H01L 29/78* | (2006.01) |
| *H01L 29/786* | (2006.01) |
| *H01L 21/02* | (2006.01) |
| *H01L 23/535* | (2006.01) |

(52) U.S. Cl.
CPC .. *H01L 21/76897* (2013.01); *H01L 21/02603* (2013.01); *H01L 21/7682* (2013.01); *H01L 21/76805* (2013.01); *H01L 21/76895* (2013.01); *H01L 23/535* (2013.01); *H01L 29/0673* (2013.01); *H01L 29/41733* (2013.01); *H01L 29/41791* (2013.01); *H01L 29/42392* (2013.01); *H01L 29/66515* (2013.01); *H01L 29/66742* (2013.01); *H01L 29/66795* (2013.01); *H01L 29/7851* (2013.01); *H01L 29/78696* (2013.01)

(58) Field of Classification Search
CPC ......... H01L 21/76897; H01L 29/41791; H01L 21/7682; H01L 29/66515; H01L 21/76805
See application file for complete search history.

(56) References Cited

U.S. PATENT DOCUMENTS

2015/0132936 A1* 5/2015 Rho .................. H01L 21/76877
438/587

* cited by examiner

*Primary Examiner* — Changhyun Yi
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes two gate structures, a first conductor, a barrier, a second conductor and a plurality of air gaps. The two gate structures are located on a surface of a semiconductor material substrate. The first conductor is disposed between the two gates structures. The barrier is disposed between the first conductor and the gate structure. The second conductor is disposed on the first conductor. The air gaps are disposed at two sides of the second conductor. A width of the second conductor is greater than a width of the first conductor.

19 Claims, 20 Drawing Sheets

TRANSISTOR WITH REDUCED GATE RESISTANCE AND IMPROVED PROCESS MARGIN OF FORMING SELF-ALIGNED CONTACT

TECHNICAL FIELD

The present disclosure relates to a semiconductor structure and a method of forming the same, and more particularly, to a semiconductor structure including at least one functional gate structure having reduced gate resistance and a self-aligned dielectric cap that is designed to increase process margin for self-aligned contact formation, and further a bit line is disposed above the self-aligned dielectric cap and electrically connected to a source-drain region through a bit line contact.

DISCUSSION OF THE BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

Self-aligned contact becomes inevitable for 10 nm node and beyond technologies due to highly scaled gate pitch. Self-aligned contact requires a self-aligned dielectric cap on top of a conductive material of a functional gate structure to electrically isolate the source/drain contact from the conductive material of the functional gate structure.

Due to the finite etch selectively between the self-aligned dielectric cap and an interlayer dielectric (ILD) material that laterally surrounds the functional gate structure, the erosion of the self-aligned dielectric cap corner is inevitable. As a result, the self-aligned dielectric cap has to be thick enough to prevent source/drain contact which can lead to source/drain contact structure to conductive material shorts and dielectric breakdown (i.e., reliability) issues. A thick self-aligned dielectric cap also means deep conductive material recess, which reduces the conductive material volume and thus increases gate resistance.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including two gate structures located on a surface of a semiconductor material substrate; a first conductor between the two gate structures; a barrier disposed between the first conductor and the gate structure; a second conductor disposed on the first conductor; and a plurality of air gaps disposed at two sides of the second conductor; wherein a width of the second conductor is greater than a width of the first conductor.

In some embodiments, a first plug in a pattern-dense region, wherein the first plug comprises a lower portion of the first conductor and an upper portion of the second conductor, and a landing pad between the lower portion and the upper portion.

In some embodiments, a second plug in a pattern-loose region, wherein the second plug is made of the second conductor.

In some embodiments, the gate structure comprises a gate conductor structure having a middle portion that has a vertical thickness that is greater than a vertical thickness of each end portion.

In some embodiments, the semiconductor device further comprises a self-aligned dielectric cap located on the gate conductor structure, wherein the self-aligned dielectric cap includes a middle portion having a vertical thickness less than a vertical thickness of each end portion.

In some embodiments, the gate structure further comprises a gate dielectric material layer located on a sidewall of the gate conductor structure and a bottommost surface of the gate conductor structure, wherein the gate dielectric material layer has a vertical thickness along the sidewall of the gate conductor structure that is less than a vertical thickness of the middle portion of the gate conductor structure.

In some embodiments, each end portion of the self-aligned dielectric cap extends onto a topmost surface of the gate dielectric material layer and a topmost surface of a dielectric spacer that is located on a sidewall of the gate dielectric material layer.

In some embodiments, the vertical thickness of the gate dielectric material layer is the same as a vertical thickness of the dielectric spacer.

In some embodiments, the vertical thickness of the gate dielectric material layer and the vertical thickness of the dielectric spacer are the same as the vertical thickness of an outermost edge of each end portion of the gate conductor structure.

In some embodiments, the semiconductor further comprises a first interlayer dielectric (ILD) material laterally surrounding the functional gate structure, and a second interlayer dielectric (ILD) material located on the first ILD material and on the self-aligned dielectric cap.

In some embodiments, the first conductor is a bit line contact, and the second conductor is a bit line.

In some embodiments, the semiconductor material substrate comprises a bulk semiconductor substrate, a topmost semiconductor material layer of a semiconductor-on-insulator, a semiconductor fin or a semiconductor nanowire.

Another aspect of the present disclosure provides a method for fabricating a semiconductor device including forming two gate structures including a gate conductor material for each on a surface of a semiconductor material substrate, a dielectric spacer on sidewalls of the two gate structures and a first interlayer dielectric (ILD) material laterally surrounding the dielectric spacer; recessing the dielectric spacer; etching the gate conductor material to form a gate conductor structure having a middle portion that has a vertical thickness that is greater than a vertical thickness of each end portion; forming a self-aligned dielectric cap on the gate conductor structure, wherein the self-aligned dielectric cap has a middle portion that has a vertical thickness that is less than a vertical thickness of each end portion; forming a second interlayer dielectric (ILD) material over the first ILD material and the self-aligned dielectric cap; forming a contact hole into the first and second ILD materials that physically exposes one of a source/drain region in the semiconductor material substrate; forming a first conductor in the contact hole and between the two gate structures; and forming a second conductor in the contact hole and on the first conductor, wherein a width of the second conductor is greater than a width of the first conductor.

In some embodiments, the step of forming the contact hole penetrating through the first and second ILD materials that physically exposes one of the source/drain regions of the gate structure further comprises: forming a lower portion between the two gate structures and contacted the dielectric spacer and the self-aligned dielectric cap; and forming an upper portion on the lower portion, between the two gate structures and contacted the self-aligned dielectric cap and the second ILD material.

In some embodiments, the method for fabricating the semiconductor device further comprises forming a barrier between the first conductor and the gate structure after forming the first conductor in the contact hole and between the two gate structures.

In some embodiments, the method for fabricating the semiconductor device further comprises forming a plurality of air gaps at two sides of the second conductor after forming the second conductor in the contact hole and on the first conductor.

In some embodiments, the first conductor is a bit line contact.

In some embodiments, the second conductor is a bit line.

In some embodiments, the step of forming two gate structures on the surface of the semiconductor material substrate further comprises: forming a gate dielectric material layer located on a sidewall of the gate conductor structure and a bottommost surface of the gate conductor structure, wherein the gate dielectric material layer has a vertical thickness along the sidewall of the gate conductor structure that is less than a vertical thickness of the middle portion of the gate conductor structure, and the gate conductor material and the gate dielectric material layer are formed the gate structure.

In some embodiments, the step of forming the self-aligned dielectric cap on the gate conductor structure further comprises: forming a concavely right angle at an upper portion of one of the end portions of the self-aligned dielectric cap, wherein at least one end portion of the self-aligned dielectric cap extends onto a topmost surface of the gate dielectric material layer and a topmost surface of a dielectric spacer that is located on a sidewall of the gate dielectric material layer.

Due to the design of the semiconductor device of the present disclosure, the first conductor and the second conductor are formed to prevent the erosion of the self-aligned dielectric cap corner. In addition, it may prevent source/drain contact which can lead to source/drain contact structure to conductive material shorts and dielectric breakdown (i.e., reliability) issues. A thick self-aligned dielectric cap which may be kept by the first conductor and the second conductor also means deep conductive material recess, which reduces the conductive material volume and thus increases gate resistance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
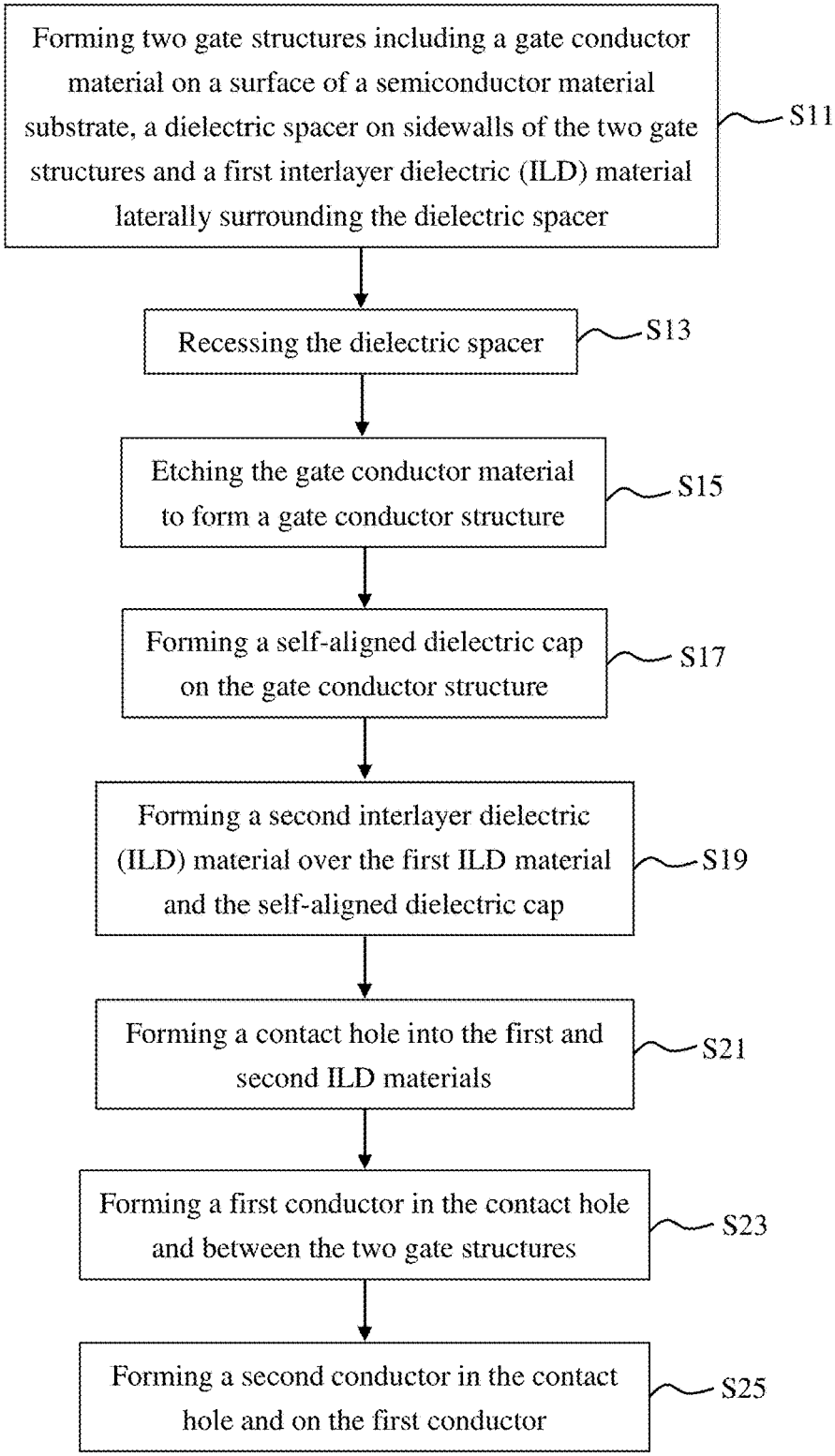
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method for fabricating a semiconductor device in accordance with one embodiment of the present disclosure; wherein the method 100 includes steps S11, S13, S15, S17, S19, S21, S23 and S25, in accordance with some embodiments. The steps S11 to S25 of FIG. 1 are described in connection with following figures.

Please refer to FIG. 1, at step S11, forming two gate structures on a surface of a semiconductor material substrate is performed. A dielectric spacer is located on a sidewall of each of the gate structures and a first interlayer dielectric (ILD) material laterally surrounds the dielectric spacer. Please refer now to FIG. 2, there is illustrated an exemplary semiconductor structure of the present application and during an early stage of stage of fabrication. Please refer to FIG. 1 and FIG. 2, the exemplary structure of FIG. 2 includes two gate structures 200 located on a surface of a semiconductor material substrate 10, wherein a dielectric spacer 14 is located on a sidewall of the gate structure 200 and a first interlayer dielectric (ILD) material 16 laterally surrounds the dielectric spacer 14. As is shown, the exemplary structure of FIG. 2 includes source/drain regions 12 located in the semiconductor material substrate 10.

Although the drawings of the present disclosure illustrate two gate structures 200 located on semiconductor material substrate 10, the present disclosure contemplates embodiments in which only a single gate structure or more than two gate structures are formed. By "gate structure" it is meant an active gate structure used to control output current (i.e., flow of carriers in the channel) of a semiconducting device through electrical or magnetic fields. In some embodiments of the present disclosure, each gate structure includes a gate dielectric material layer 18 and a gate conductor material 20.

Figure 2:
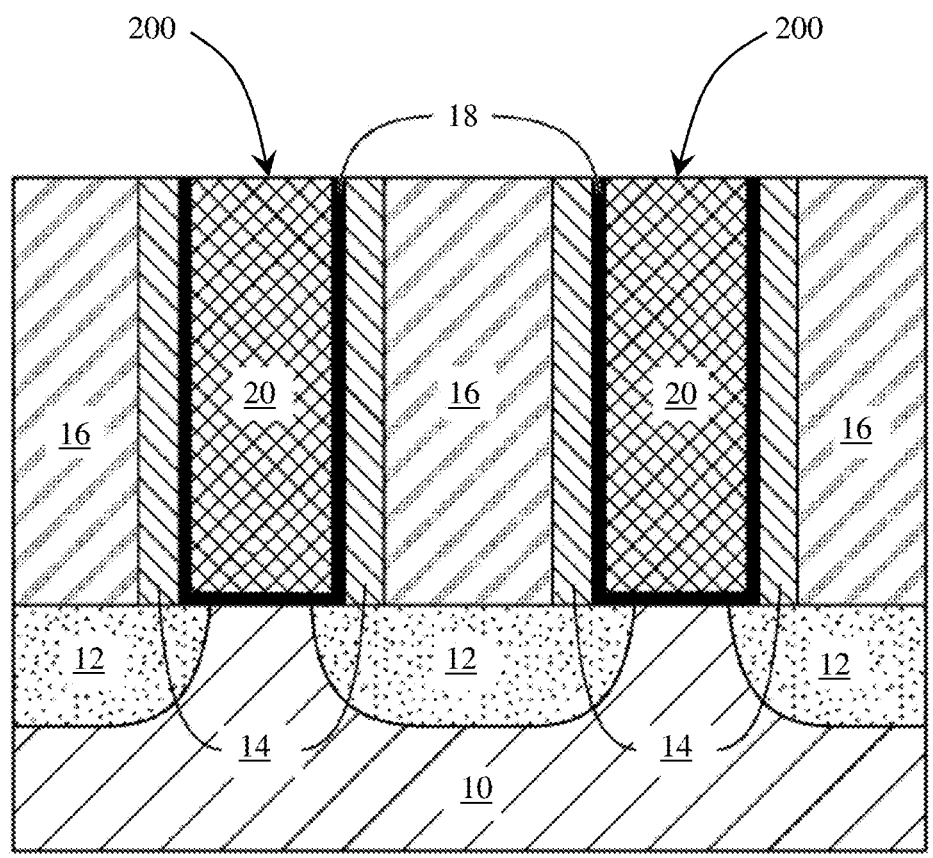
FIG. 2 is a cross sectional view of an exemplary semiconductor structure of the present disclosure and during an early stage of stage of fabrication, the structure including two gate structures located on a surface of a semiconductor material substrate, wherein a dielectric spacer is located on a sidewall of the gate structure and a first interlayer dielectric (ILD) material laterally surrounds the dielectric spacer.

In one embodiment of the present disclosure, the exemplary semiconductor structure of FIG. 2 can be formed utilizing a gate first process. In a gate first process, the gate structure 200 is first formed on a surface of semiconductor material substrate 10. After forming the gate structure 200, the dielectric spacer 14 is formed on the sidewalls of the gate structure. The source/drain regions 12 are formed into the semiconductor material substrate 10 and at the footprint of each gate structure 200. Next, the first ILD material 16 is formed. In such an embodiment, the gate dielectric material layer 18 is located only beneath a bottommost surface of the gate conductor material 20.

In another embodiment of the present disclosure, the exemplary semiconductor structure of FIG. 2 can be formed utilizing a gate last process. In a gate last process, at least one sacrificial gate structure (not shown) is first formed on a surface of semiconductor material substrate 10. After forming the sacrificial gate structure, the dielectric spacers 14 are formed. Next, source/drain regions 12 are formed into the semiconductor material substrate 10 and at the footprint of each sacrificial gate structure. Next, the first ILD material 16 is formed. After forming the first ILD material 16, each sacrificial gate structure is removed and replaced with a functional gate structure 200. In such an embodiment as shown in FIG. 2, the gate last process provides a structure in which the gate dielectric material layer 18 is present along the sidewalls of each gate conductor material 20 and beneath a bottommost surface of the gate conductor material 20. In such an embodiment, the gate dielectric material layer 18 may be referred to as a U-shaped gate dielectric material layer.

The semiconductor material substrate 10 of the present disclosure is composed of one or more semiconductor materials having semiconducting properties. Examples of semiconductor materials that may be used as the semiconductor material substrate 10 include, but are not limited to, silicon (Si), a silicon germanium (SiGe) alloy, a silicon germanium carbide (SiGeC) alloy, germanium (Ge), a III-V compound semiconductor, or a II-VI compound semiconductor.

In one embodiment, the semiconductor material substrate 10 may be a bulk semiconductor substrate. The term "bulk semiconductor substrate" denotes a substrate that is composed entirely of one or more semiconductor materials, as defined above. In such an embodiment, the gate structure 200 is located only upon a topmost surface of the semiconductor material substrate 10.

In another embodiment, the semiconductor material substrate 10 may be a topmost semiconductor material layer of a semiconductor-on-insulator (SOI) substrate. The SOI substrate further include an insulator layer that contacts a bottommost surface of the topmost semiconductor material layer, and a handle substrate that contacts a bottommost surface of the insulator layer; in other terms an SOI substrate includes an insulator layer sandwiched between a topmost surface material layer and a handle substrate. In such an embodiment, the gate structure 200 is located only upon a topmost surface of the semiconductor material substrate 10.

In a further embodiment of the present disclosure, the semiconductor material substrate 10 may be a semiconductor material fin. The term "semiconductor material fin" refers to a structure composed of a semiconductor material, as defined above, that includes a pair of vertical sidewalls that are parallel to each other. A surface is "vertical" if there exists a vertical plane from which the surface does not deviate by more than three times the root mean square roughness of the surface. In one embodiment, the semiconductor material fin has a height from 20 nm to 200 nm, a width from 5 nm to 30 nm, and a length from 20 nm to 200 nm. Other heights and/or widths and/or lengths that are less than, or greater than, the ranges mentioned herein can also be used in the present disclosure. In such an embodiment, a single semiconductor material fin or a plurality of semiconductor material fins may be employed. The semiconductor material fin(s) can be formed by patterning an upper portion of a bulk semiconductor substrate, as defined above, or by patterning of a topmost semiconductor layer of a SOI substrate, as defined above. Patterning may be performed by lithography and etching, a sidewall image transfer (SIT) process or by direct self-assembly (DSA) process in which a copolymer that is capable of direct self-assembly is used.

In a yet further embodiment of the present disclosure, the semiconductor material substrate 10 may be a semiconductor nanowire. The term "semiconductor nanowire" refers to a structure composed of a semiconductor material, as defined above, that has a diameter on the order of a few nanometers or less. A single semiconductor nanowire or a plurality of semiconductor nanowires may be employed. When a plurality of nanowires is employed, the nanowires may be in a vertical stacked configuration or they may be located laterally adjacent to each other. The semiconductor nanowire(s) can be formed utilizing techniques well known to those skilled in the art. The semiconductor material substrate 10 can also be a semiconductor nanosheet. A semiconductor nanosheet is a sheet of a semiconductor material. The nanosheets may be formed utilizing techniques well known to those skilled in the art.

The source/drain regions 12 are composed of a semiconductor material, as defined above, and a p-type dopant or an n-type dopant. Typically, but not necessarily always, the source/drain regions 12 are composed of a same semiconductor material as the semiconductor material substrate 10. In embodiments in which the source/drain regions 12 are composed of a different semiconductor material than the semiconductor material substrate 10, a strain may be applied to a channel region of the gate structure 200. As is known to those skilled in the art, the channel region is a portion of the semiconductor material substrate 10 that is located beneath the gate structure 200 and between a source region that is located on one side of the gate structure, and a drain region that is located on the other side of the gate structure. The source region and the drain region are referred to herein as source/drain regions 12. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain regions may have a dopant concentration of from $4 \times 10^{20}$ atoms/cm$^3$ to $3 \times 10^{21}$ atoms/cm$^3$.

In some embodiments, the source/drain regions 12 can be formed by introducing a p-type dopant or an n-type dopant, as defined above, into portions of the semiconductor material substrate 10. The dopants may be introduced into portions of the semiconductor material substrate 10 by ion implantation, gas phase doping, or by using a sacrificial material that contains one of the dopants mentioned above.

In another embodiment, the source/drain regions 12 can be formed by forming source/drain trenches into the semiconductor material substrate 10 and thereafter filling of each trench with an n-type or p-type doped semiconductor material. The filling of the source/drain trenches may include an epitaxial growth process. The term "epitaxial growth" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the of the source/drain regions 12 can be performed utilizing any well-known precursor gas or gas mixture. Carrier gases like hydrogen, nitrogen, helium and argon can be used. In some embodiments, the n-type dopant of p-type dopant is introduced into the precursor gas or gas mixture. In other embodiments, the n-type dopant of p-type dopant is introduced into an intrinsic semiconductor material that is epitaxially grown into each source/drain trench.

As mentioned above, the gate structure 200 may include a gate dielectric material layer 18 and a gate conductor material 20. The gate dielectric material layer 18 includes any gate dielectric material. The gate dielectric material that provides the gate dielectric material layer 18 can be an oxide, nitride, and/or oxynitride. In one example, the gate dielectric material that provides the gate dielectric material layer 18 can be a high-k material having a dielectric constant greater than 4.0. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure composed of different gate dielectric materials, e.g., silicon dioxide, and a high-k gate dielectric, can be formed and used as the gate dielectric material layer 18.

The gate dielectric material used in providing gate dielectric material layer 18 can be formed by any deposition process including, for example, atomic layer deposition (ALD), chemical vapor deposition (CVD), plasma enhanced chemical vapor deposition (PECVD), physical vapor deposition (PVD), sputtering, or atomic layer deposition. In one embodiment of the present disclosure, the gate dielectric material used in providing the gate dielectric material layer 18 can have a thickness in a range from 1 nm to 10 nm. Other thicknesses that are less than, or greater than, the aforementioned thickness range can also be employed for the gate dielectric material that may provide the gate dielectric material layer 18.

The gate conductor material 20 of the gate structure includes any conductive material including, for example, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g., $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, a work-function setting layer (not shown) may be located between the gate dielectric material layer 18 and the gate conductor material 20. The work-function setting layer can be a work-function metal (WFM). The WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both the gate conductor material 20 and the WFM.

The gate conductor material 20 and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc. When a metal silicide is formed, a conventional silicidation process is employed. In one embodiment, the gate conductor material used in providing the gate conductor material 20 can have a thickness from 50 nm to 200 nm. Other thicknesses that are less than, or greater than, the aforementioned thickness range can also be employed for the gate conductor material used in providing the gate conductor material 20.

The gate structure 200 can be formed by providing a gate material stack of the gate dielectric material, and the gate conductor material. A planarization process may follow the formation of the gate material stack. In one embodiment, and when multiple gate structures are formed, each gate structure may be composed of the same gate dielectric material and/or gate conductor material. In another embodiment, and when multiple gate structures are formed, a first set of gate structures may be composed of a first gate dielectric material and a first gate conductor material, while a second set of gate structures may be composed of a second gate dielectric material and a second gate conductor material. In such an embodiment, the second gate conductor material is typically different from the first gate conductor material; the first and second gate dielectric materials may be the same or different. In such an embodiment, block mask technology may be used to provide gate structures that have at least different gate conductor materials.

The dielectric spacer 14 is composed of a dielectric spacer material. The dielectric spacer material is typically different from the gate dielectric material that provides the gate dielectric material layer 18. One example of a dielectric spacer material that may be employed in the present application is silicon nitride. The dielectric spacer 14 may be formed by deposition of a dielectric spacer material, followed by a spacer etch. The deposition of the dielectric spacer material includes, for example, atomic layer deposition (ALD), chemical vapor deposition (CVD), plasma enhanced chemical vapor deposition (PECVD), or physical vapor deposition (PVD). The spacer etch may include a reactive ion etch. In some embodiments (not shown), the dielectric spacer 14 contacts an entirety of a sidewall of the gate conductor material 20. In other embodiments (as illustrated in FIG. 2), the dielectric spacer 14 contacts a sidewall of the gate dielectric material layer 14.

The first ILD material 16, which is laterally adjacent to the dielectric spacer and laterally surrounds the gate structure 200, is composed of a dielectric material that is compositionally different from the dielectric material of the dielectric spacer 14. Examples of dielectric materials that can be used as the first ILD material 16 in the present disclosure include silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present disclosure denotes a dielectric material that has a dielectric constant of less than 4.0. In some embodiments, a dielectric liner (e.g., silicon nitride, not shown) is formed prior to the first ILD material 16 and is located on the sidewalls of the dielectric spacer 14 and on top of the source/drain regions 12.

In one embodiment, the first ILD material 16 can be formed by a deposition process such as, for example, chemical vapor deposition (CVD), plasma enhanced chemical vapor deposition (PECVD), evaporation or spin-on coating. Following the deposition of the ILD material 16, a planarization process such as, for example, chemical mechanical polishing (CMP) and/or grinding, may or may not be employed. The first ILD material 16 typically has a topmost surface that is coplanar with a topmost surface of the dielectric spacer 14, and a topmost surface of each functional gate structure 200.

Figure 3:
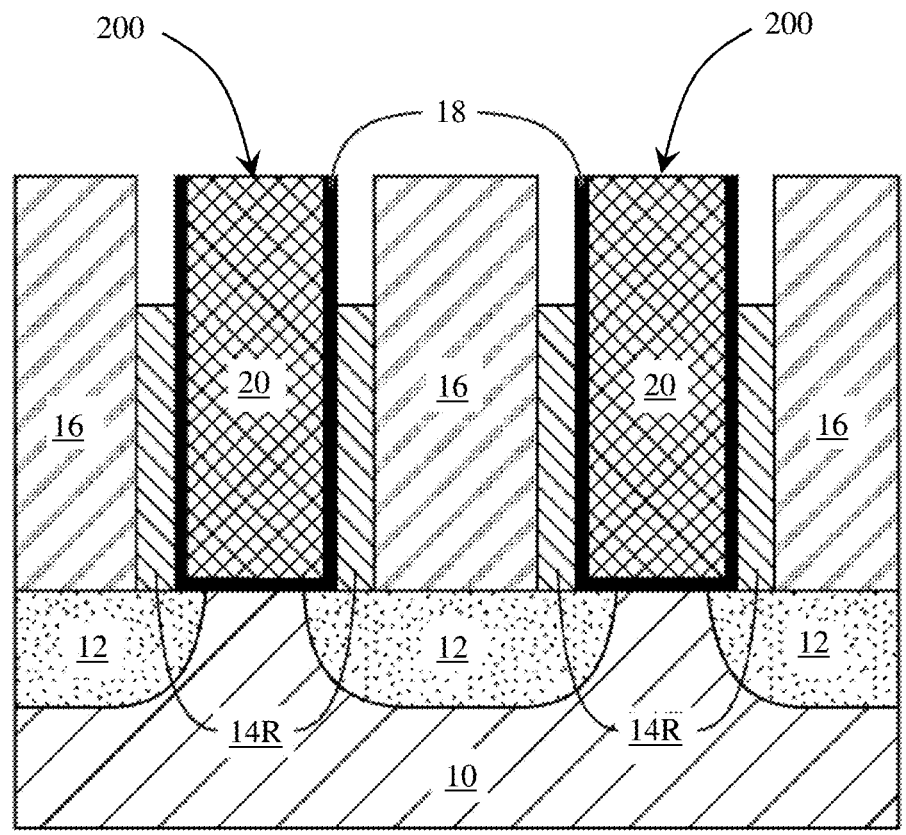
FIG. 3 is a cross sectional view of the exemplary semiconductor structure of FIG. 2 after recessing the dielectric spacer.

Please refer to FIG. 1, at step S13, recessing the dielectric spacer is performed. Referring now to FIG. 3, there is illustrated the exemplary semiconductor structure of FIG. 2 after recessing the dielectric spacer 14. Please refer to FIG. 1 and FIG. 3, the remaining portion of the dielectric spacer 14 after recessing may be referred to a first recessed dielectric spacer 14R. The recessing of the dielectric spacer 14 may be performed utilizing an isotropic etching process such as, for example, reactive ion etching, chemical dry etching, or chemical wet etching. The first recessed dielectric spacer 14R has a height, i.e., vertical thickness, which is less than the original height, i.e., vertical thickness, of the dielectric spacer 14. The first recessed dielectric spacer 14R has a topmost surface that is located beneath the topmost surface of the first ILD material 16 and a topmost surface of the functional gate structure 200. In embodiments in which the gate dielectric material layer 18 is Li-shaped, an upper portion of a sidewall of the dielectric spacer material layer 18 is physically exposed. In embodiments in which the gate dielectric material layer 18 is non-U-shaped, an upper portion of a sidewall of the gate conductor material 20 is physically exposed.

Figure 4:
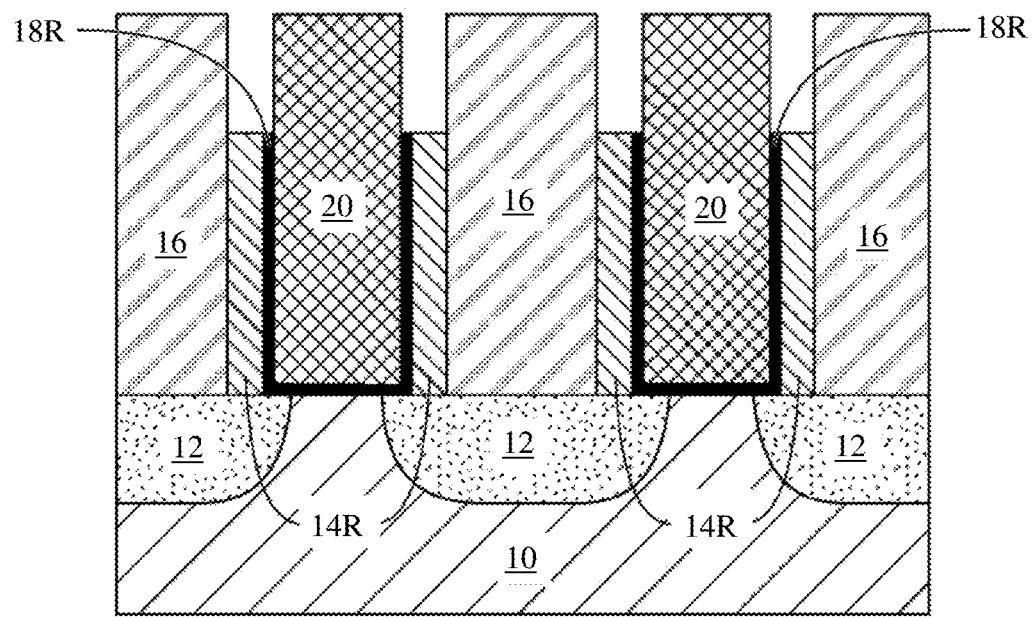
FIG. 4 is a cross sectional view of the exemplary semiconductor structure of FIG. 3 after recessing the gate dielectric material layer of the gate structure.

Please refer to FIG. 1, at step S15, etching a gate conductor material of each of the gate structure to provide a gate conductor structure having a middle portion that has a vertical thickness that is greater than a vertical thickness of each end portion is performed. Referring now to FIG. 4, there is illustrated the exemplary semiconductor structure of FIG. 3 after recessing the gate dielectric material layer 18 of the gate structure 200. Please refer to FIG. 1 and FIG. 4, in some embodiments and when the gate dielectric material layer 18 is other than U-shaped, this step of the present disclosure may be omitted. The remaining portion of the gate dielectric material layer 18 after recessing may be referred to a first recessed gate dielectric material layer 18R. The recessing of the gate dielectric material layer 18 may be performed utilizing an isotropic etching process such as, for example, plasma etching, or chemical wet etching.

The first recessed gate dielectric material layer 18R has a height, i.e., vertical thickness, that is less than the original height, i.e., vertical thickness, of the gate dielectric material layer 18. The first recessed gate dielectric material layer 18R has a topmost surface that is located beneath the topmost surface of the first ILD material 16 and a topmost surface of the gate conductor material 20. In the illustrated embodiment, the recessing of the gate dielectric material layer 18, physically exposes an upper portion of a sidewall of the gate conductor material 20.

The height, i.e., vertical thickness, of the first recessed gate dielectric material layer 18R may be the same as, or different from, the height, i.e., vertical thickness, of the first recessed dielectric spacer 14R. FIG. 4 illustrates an embodiment in which the first recessed gate dielectric material layer 18R and the first recessed dielectric spacer 14R have a same height, i.e., vertical thickness, thus the topmost surfaces of the first recessed gate dielectric material layer 18R and the first recessed dielectric spacer 14R are coplanar with each other.

Figure 5:
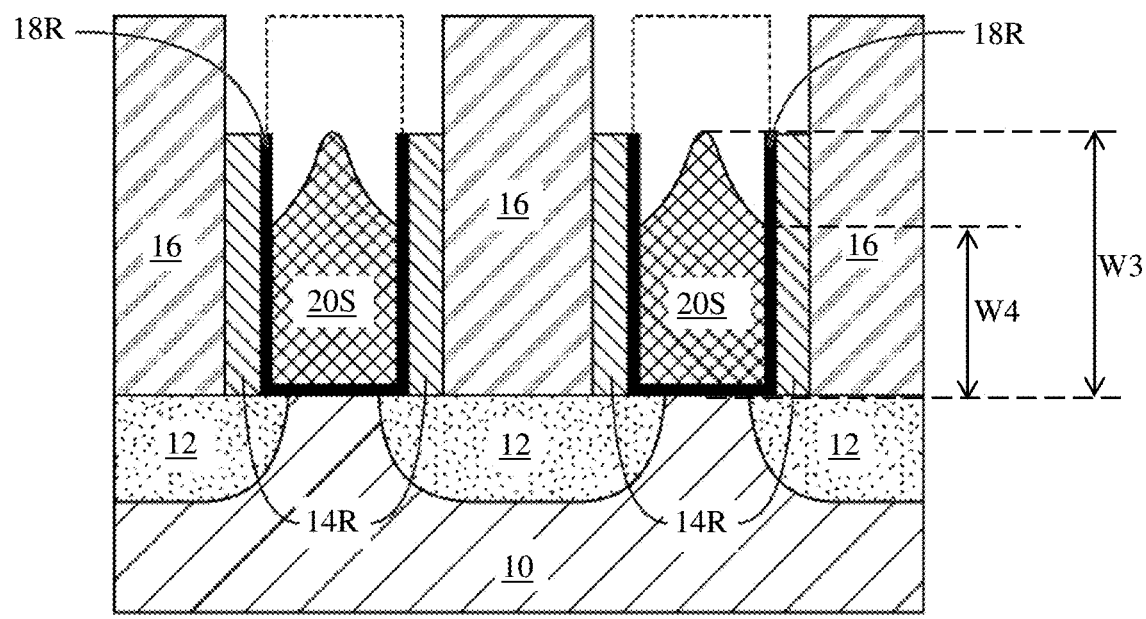
FIG. 5 is a cross sectional view of the exemplary semiconductor structure of FIG. 4 after etching the gate conductor material to provide a gate conductor structure having a middle portion that has a vertical thickness that is greater than a vertical thickness of each end portion.

Referring now to FIG. 5, there is illustrated the exemplary semiconductor structure of FIG. 4 after etching the gate conductor material 20 to provide a gate conductor structure 20S having a middle portion that has a vertical thickness W3 (i.e., height) that is greater than a vertical thickness W4 (i.e., height) of each end portion; the end portions are located laterally adjacent each first recessed dielectric spacer 14R. That is, the gate conductor structure 20S that is provided by this etch is taller in the middle of the gate conductor structure 20S and shorter at the end portions of the gate conductor structure 20S. In FIG. 5, the dotted line represents the original height of the gate conductor material 20 prior to performing this etch. A gate structure including gate conductor structure 20S has reduced gate resistance. The etch used in providing the gate conductor structure 20S is an isotropic etch that is selective in removing a gate conductive material. The middle portion of the gate conductor structure 20S may have a topmost surface that is coplanar with, above, or below, the topmost surface of first recessed gate dielectric material layer 18R and the first recessed dielectric spacer 14R. The end portions of the gate conductor structure 20S have topmost surfaces that are below the topmost surface of the first recessed gate dielectric material layer 18R and the first recessed dielectric spacer 14R.

Figure 6:
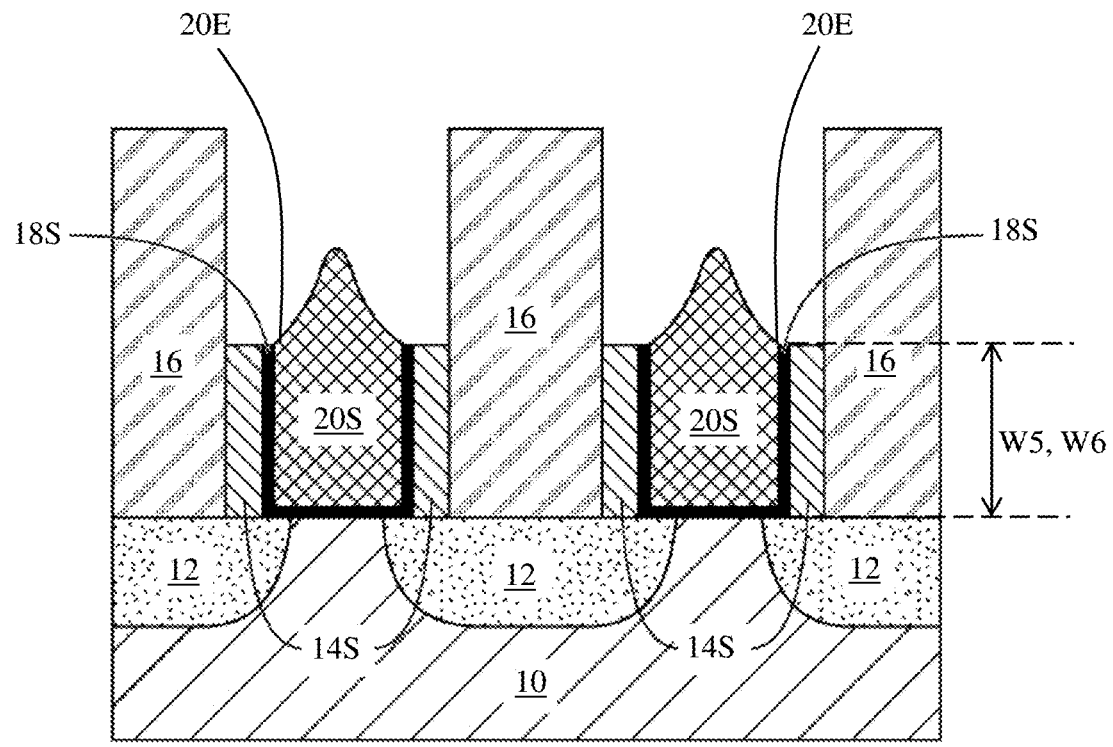
FIG. 6 is a cross sectional view of the exemplary semiconductor structure of FIG. 5 after second recessing of the dielectric spacer and the gate dielectric material layer.

Referring now to FIG. 6, there is illustrated the exemplary semiconductor structure of FIG. 5 after second recessing of the dielectric spacer (i.e., the first recessed dielectric spacer 14R) and the gate dielectric material layer (i.e., the first recessed gate dielectric material layer 18R). In some embodiments, the second recessing of the dielectric spacer and/or the gate dielectric material layer may be omitted.

The remaining portion of the first recessed dielectric spacer 14R may be referred to herein as a second recessed dielectric spacer 14S, while the remaining portion of the first recessed gate dielectric material layer 18R may be referred to a second recessed gate dielectric material layer 18S. The second recessing of the first recessed dielectric spacer 14R typically occurs prior to the second recessing of the first recessed gate dielectric material layer 18R.

The second recessing of the first recessed dielectric spacer 14R may be performed utilizing one the anisotropic etching processes mentioned above for recessing the dielectric spacer 14. The second recessed dielectric spacer 14S has a height, i.e., vertical thickness, that is less than the height, i.e., vertical thickness, of the recessed dielectric spacer 14R. The second recessed dielectric spacer 14S has a topmost surface that is located beneath the topmost surface of the first ILD material 16 and a topmost surface of the gate material structure 20S. In embodiments in which a U-shaped gate dielectric material layer is used, an upper portion of a sidewall of the first recessed dielectric spacer material layer 18R is physically exposed. In embodiments in which the gate dielectric material layer 18 is non-U-shaped, an upper portion of a sidewall of the gate conductor structure 20S is physically exposed.

The second recessing of the first recessed gate dielectric material layer 18R may be performed utilizing one the etching processes mentioned above for recessing the gate dielectric material layer 18. The second recessed gate dielectric material layer 18S has a height, i.e., vertical thickness, that is less than the height, i.e., vertical thickness, of the first recessed gate dielectric material layer 18R. The second recessed gate dielectric material layer 18S has a topmost surface that is located beneath the topmost surface of the first ILD material 16 and a topmost surface of the gate material structure 20S. In embodiments in which the gate dielectric material layer 18 is non-U-shaped, an upper portion of a sidewall of the gate conductor structure 20S is physically exposed.

In some embodiments, the second recessed gate dielectric material layer 18S may have a vertical thickness W6 that is the same as the vertical thickness W5 of second recessed dielectric spacer 14S. In such an embodiment, the second recessed gate dielectric material layer 18S has a topmost surface that is coplanar with a topmost surface of the second recessed dielectric spacer 14S. In some embodiments, the vertical thickness of the second recessed gate dielectric material layer 18S and the vertical thickness of the second recessed dielectric spacer 14S are the same as the vertical thickness of outermost edge 20E of the end portion of the gate conductor structure 20S.

Figure 7:
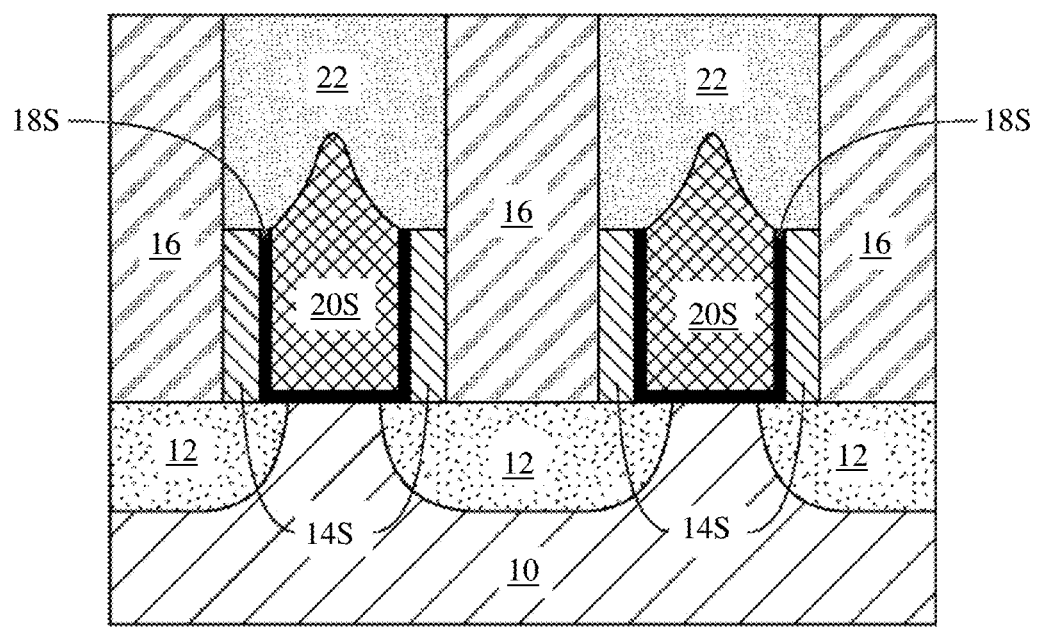
FIG. 7 is a cross sectional view of the exemplary semiconductor structure of FIG. 6 after forming a self-aligned dielectric cap on the gate conductor structure, wherein the self-aligned dielectric cap has a middle portion that has a vertical thickness that is less than a vertical thickness of each end portion.

Please refer o FIG. 1, at step S17, forming a self-aligned dielectric cap on the gate conductor structure, wherein the self-aligned dielectric cap has a middle portion that has a vertical thickness that is less than a vertical thickness of each end portion. Referring now to FIG. 7, there is illustrated the exemplary semiconductor structure of FIG. 6 after forming a self-aligned dielectric cap 22 on gate conductor structure 20S, wherein the self-aligned dielectric cap 22 has a middle portion that has a vertical thickness that is less than a vertical thickness of each end portion. The self-aligned dielectric cap 22 of the present disclosure improves the process margin for forming a self-aligned source/drain contact structure (see, element 34 in FIG. 10 of the present disclosure).

Please refer to FIG. 1 and FIG. 7, as is shown, the middle portion of the self-aligned dielectric cap 22 coincides over the middle portion of the gate conductor structure 20S. In some embodiments, and as is shown in FIG. 7, each end portion of the self-aligned dielectric cap 22 extends onto a topmost surface of a remaining portion of the gate dielectric material layer (i.e., either the first or second recessed gate dielectric material layer (18R, 18S)) and a topmost surface of a remaining portion of the dielectric spacer (i.e., the first or second recessed dielectric spacer (14R, 14S)). In some embodiments, and when the gate dielectric material layer 18 is located entirely beneath the gate conductor material 20, each end portion of the self-aligned dielectric cap 22 extends onto a topmost surface of a remaining portion of a topmost surface of a remaining portion of the dielectric spacer (i.e., the first or second recessed dielectric spacer (14R, 14S)).

The self-aligned dielectric cap 22 has outermost sidewalls that are vertically aligned to the outermost sidewalls of the remaining portion of the dielectric spacer (i.e., the first or second recessed dielectric spacer (14R, 14S)). The self-aligned dielectric cap 22 has a topmost surface that is coplanar with a topmost surface of the first ILD material 16. The self-aligned dielectric cap 22 has a sidewall that directly contacts an upper sidewall of the first ILD material 16.

The self-aligned dielectric cap 22 is composed of a dielectric material that is compositionally different from the first ILD material 16. In one example, the self-aligned dielectric cap 22 is composed of silicon nitride. Other dielectric materials that may be used in providing the self-aligned dielectric cap 22 include, but are not limited to, silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, and combinations thereof.

The self-aligned dielectric cap 22 can be formed utilizing a deposition process such as, for example, CVD, PECVD, ALD, high density plasma CVD (HDP CVD) deposition, sputtering, or any suitable combination of those deposition techniques. A planarization may follow the deposition of the dielectric material that provides the self-aligned dielectric cap 22. Another advantage of the present disclosure is that, the taller gate conductor structure 20S in the middle portion makes the opening above the gate conductor structure 20S easier to fill without void, resulting in a void-free self-aligned dielectric cap 22.

Figure 8:
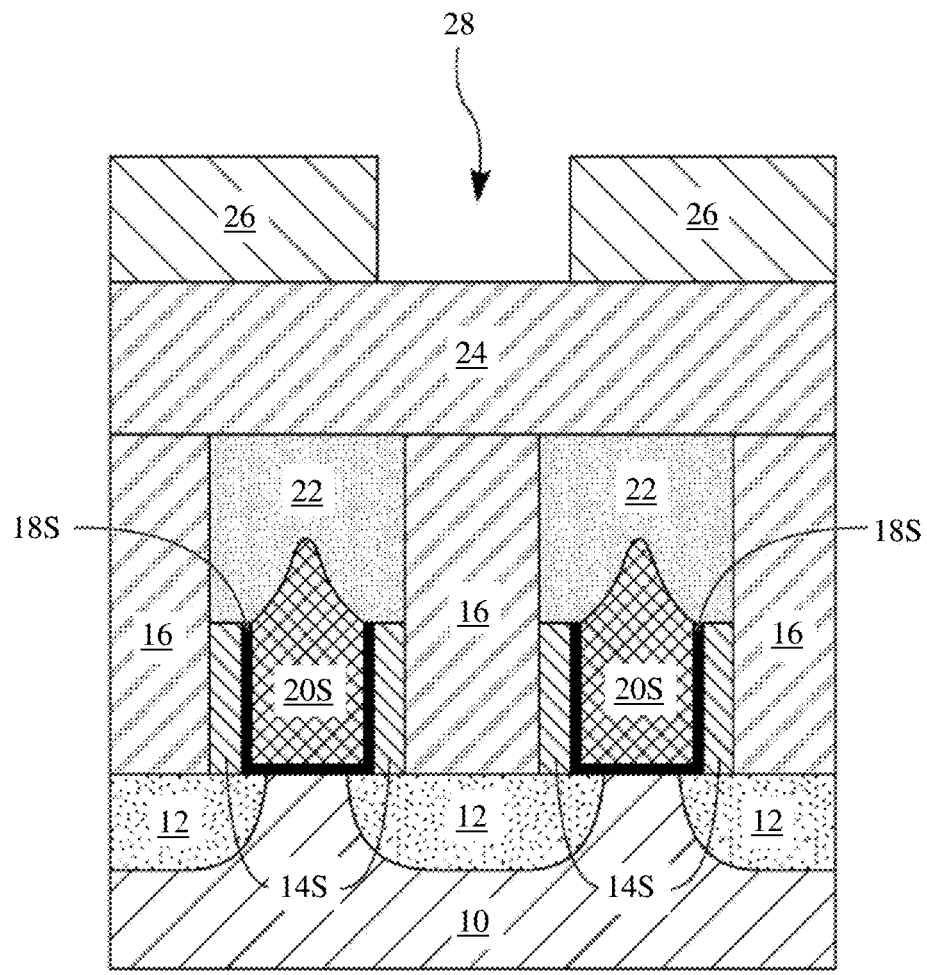
FIG. 8 is a cross sectional view of the exemplary semiconductor structure of FIG. 7 after forming a second ILD material over the first ILD material and the self-aligned dielectric cap, and forming a patterned mask on the second ILD material, wherein the patterned mask has an opening located above a source/drain region of the gate structure.

Please refer to FIG. 1, at step S19, forming a second interlayer dielectric (ILD) material over the first ILD material and the self-aligned dielectric cap is performed. Referring now to FIG. 8, there is illustrated the exemplary semiconductor structure of FIG. 7 after forming a second ILD material 24 over the first ILD material 16 and the self-aligned dielectric cap 22, and forming a patterned mask 26 on the second ILD material 24, wherein the patterned mask 26 has an opening 28 that is located above a source/drain region 12 of the gate structure 200.

The second ILD material 24 is composed of one of the dielectric materials mentioned above for the first ILD material 16 with the proviso that dielectric material that provides the second ILD material 24 is compositionally different from the self-aligned dielectric cap 22. In one embodiment, the second ILD material 24 is composed of a same dielectric material as the first ILD material 16. In another embodiment, the second ILD material 24 is composed of a dielectric material that is compositionally different from the first ILD material 16. The second ILD material 24 may be formed utilizing one of the deposition processes mentioned above for forming the first dielectric material 16. A planarization process may or may not follow the deposition of the dielectric material that provides the second ILD material 24. The second ILD material 24 may have a thickness within the thickness range mentioned above for the first ILD material 16.

The patterned mask 26 is composed of any photoresist material. The patterned mask 26 may be formed by first depositing a photoresist material on the second ILD material 24, and thereafter the deposited photoresist material is patterned by lithography. Lithography includes exposing the photoresist material to a pattern of irradiation and developing the exposed photoresist material utilizing a conventional resist developer. Alternatively, the patterned mask 26 may be formed by a hardmask layer (e.g., titanium nitride). Lithography is then used to pattern the hardmask layer. The hardmask layer is then used to pattern the underneath ILD material to form contact hole.

Figure 9:
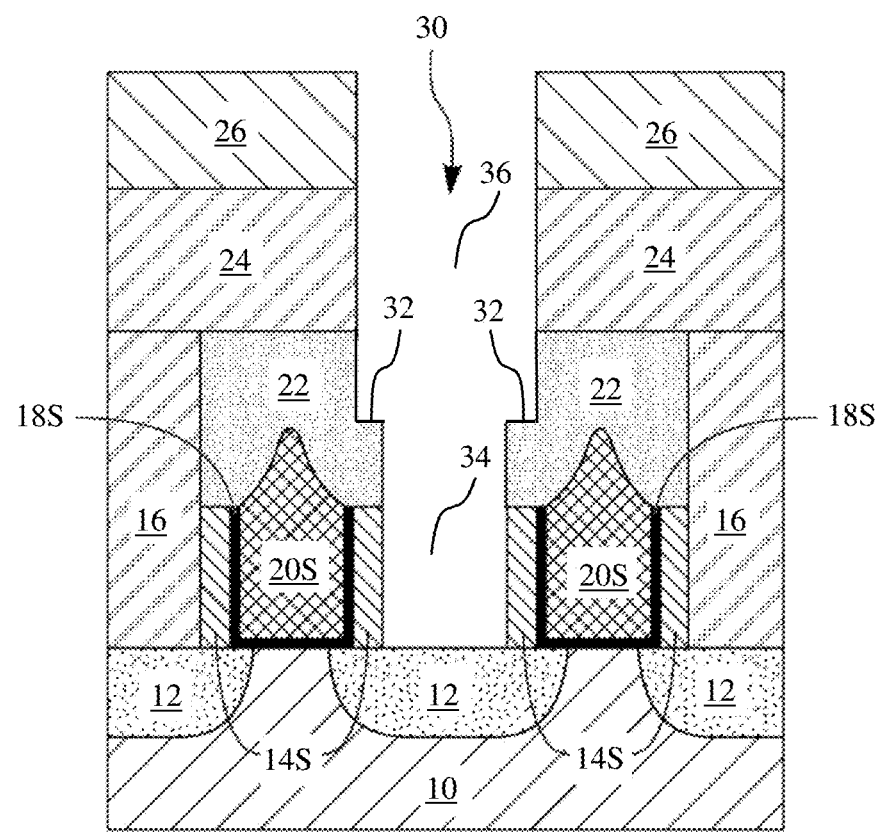
FIG. 9 is a cross sectional view of the exemplary semiconductor structure of FIG. 8 after transferring the opening into the first and second ILD materials to provide a contact hole that physically exposes one of the source/drain regions of the functional gate structure.

Please refer to FIG. 1, at step S21, forming a contact hole into the first and second ILD materials is performed. Referring now to FIG. 9, there is illustrated the exemplary semiconductor structure of FIG. 8 after transferring the opening 28 into the first and second ILD materials (16, 24) to provide a contact hole 30 that physically exposes one of the source/drain regions 12. Please refer to FIG. 1 and FIG. 9, during this transferring step, a corner of one of the end portions of the self-aligned dielectric cap 22 is eroded, as is shown in FIG. 9. The transferring of the opening 28 includes one or more anisotropic etching processes such as, for example, a directional reactive ion etch. This step provides a self-aligned dielectric cap 22 in which an upper portion of one of the end portions of the self-aligned dielectric cap 22 has a concavely right angle 32. The concavely right angle 32 connects the topmost surface of the self-aligned dielectric cap 22 to a remaining portion of the vertical sidewall of the self-aligned dielectric cap 22.

In some embodiments of the present disclosure, the contact hole 30 includes a lower portion 34 and an upper portion 36. The lower portion 34 is disposed between the two gate structures 200 and contacted the dielectric spacer 14 (the second recessed dielectric spacer 14S) and the self-aligned dielectric cap 22 (below the bottom of the right angle 32). The upper portion 36 is disposed between the two gate structures and contacted the self-aligned dielectric cap 22 (above the bottom of the right angle 32) and the second ILD material 24.

Figure 10:
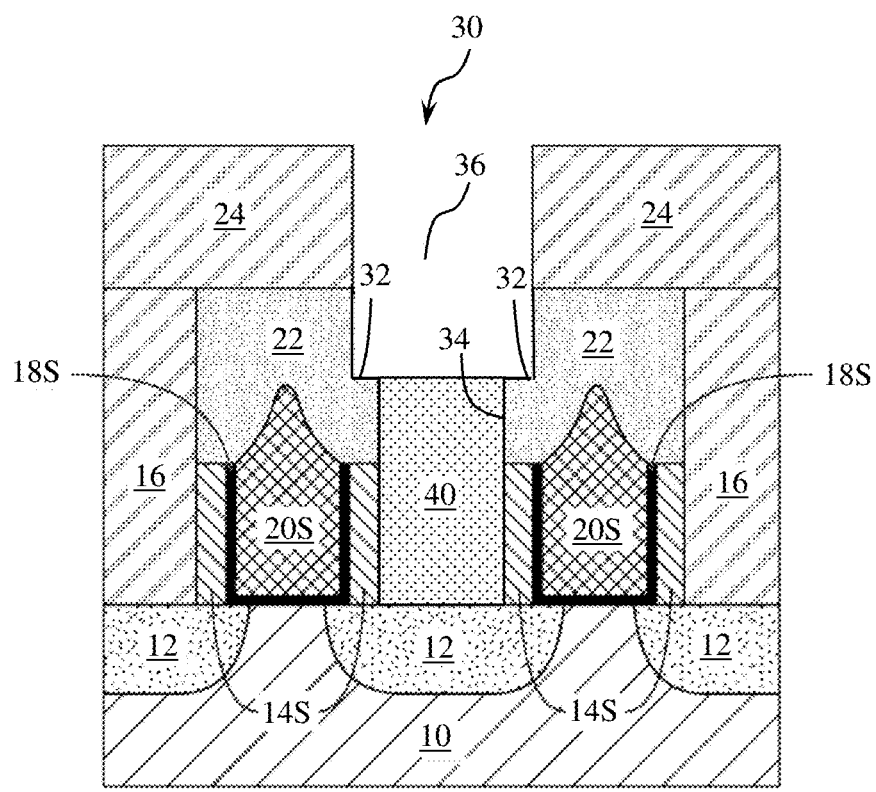
FIG. 10 is a cross sectional view of the exemplary semiconductor structure of FIG. 9 after forming a barrier in a lower portion of the contact hole.

Referring now to FIG. 10, there is illustrated the exemplary semiconductor structure of FIG. 9 after forming a barrier 40 in the lower portion 34 of the contact hole 30. The barrier 40 may be formed of, for example, titanium, titanium nitride, titanium-tungsten alloy, tantalum, tantalum nitride, or the combination thereof. In some embodiments of the present disclosure, the barrier 40 is formed in the lower portion 34 of the contact hole 30. The topmost surface of the barrier 40 is coplanar with the bottom of the right angle 32 of the contact hole 30.

Figure 11:
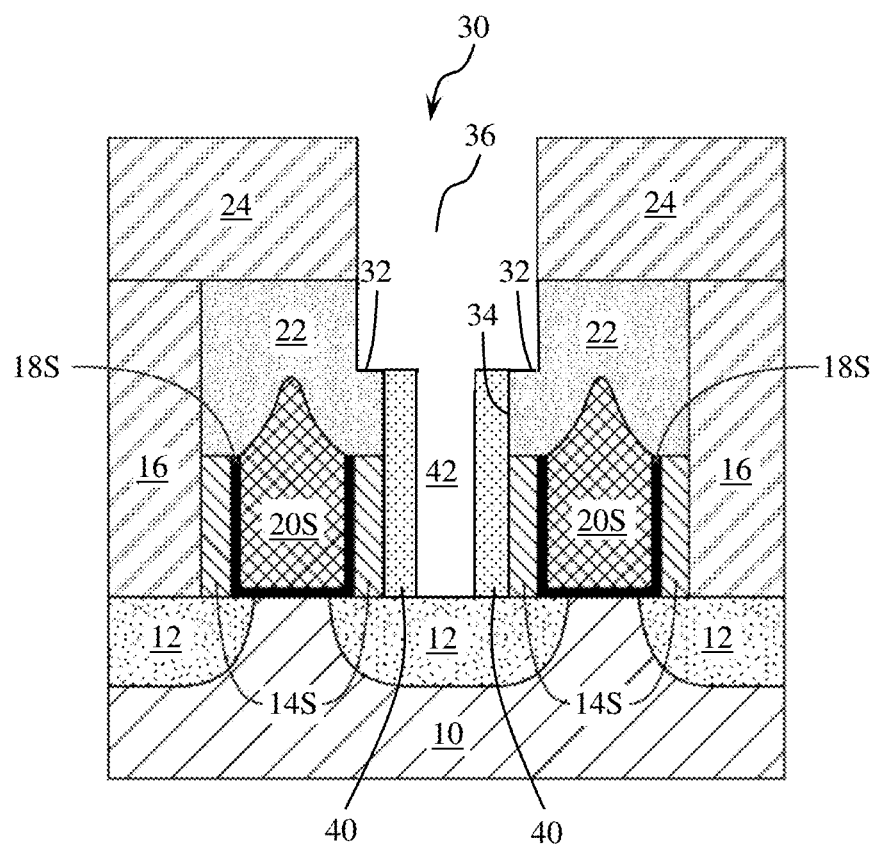
FIG. 11 is a cross sectional view of the exemplary semiconductor structure of FIG. 10 after forming an opening in the barrier.

Referring now to FIG. 11, there is illustrated the exemplary semiconductor structure of FIG. 10 after forming an opening 42 in the barrier 40. An etching process may be used for etching the barrier 40 to form an opening 42. The etching process may be performed utilizing one the etching processes mentioned above for forming the opening 42.

Figure 12:
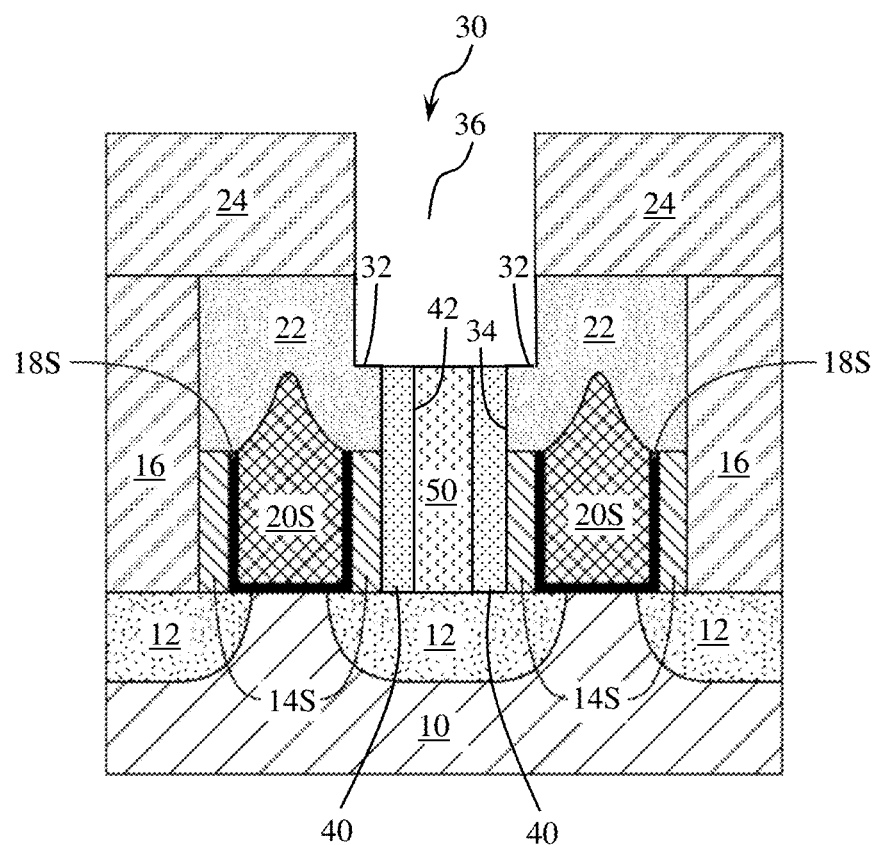
FIG. 12 is a cross sectional view of the exemplary semiconductor structure of FIG. 11 after forming a first conductor in the opening of the barrier.

Please refer to FIG. 1, at step S23, forming a first conductor in the contact hole and between the two gate structures is performed. Referring now to FIG. 12, there is illustrated the exemplary semiconductor structure of FIG. 11 after forming a first conductor 50 in the opening 42 of the barrier 40. Please refer to FIG. 1 and FIG. 12, the first conductor 50 is filled or deposited in the opening 42 of the barrier 50. The topmost surface of the first conductor 50 is coplanar with the bottom of the right angle 32. The deposition process may be performed utilizing one the deposition processes mentioned above for filling or depositing the first conductor 50 in the opening 42 of the barrier 50. In some embodiments of the present disclosure, the first conductor 50 is a bit line contact (BLC).

Figure 13:
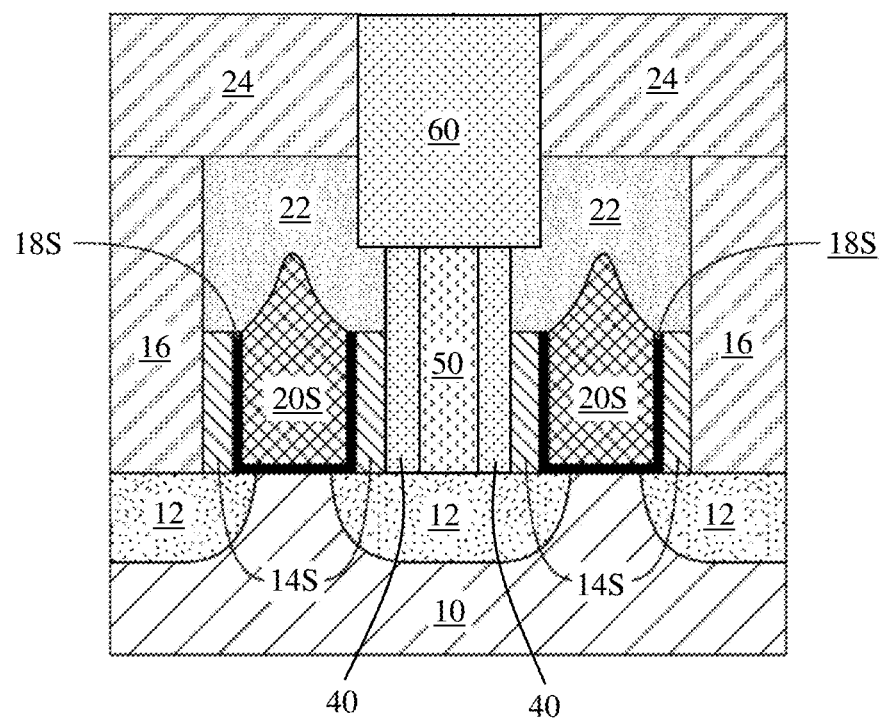
FIG. 13 is a cross sectional view of the exemplary semiconductor structure of FIG. 12 after filling a sacrificial material in an upper portion of the contact hole.

Referring now to FIG. 13, there is illustrated the exemplary semiconductor structure of FIG. 12 after filling a sacrificial material 60 in the upper portion 36 of the contact hole 30. In some embodiments of the present disclosure, a sacrificial material 60 is formed or deposited in the upper portion 36 of the contact hole 30 after forming the first conductor 50 in the opening 42 of the barrier 40. The sacrificial material 60 is disposed above the first conductor 50. The deposition process may be performed utilizing one the deposition processes mentioned above for forming or depositing the sacrificial material 60 above the first conductor 50.

Figure 14:
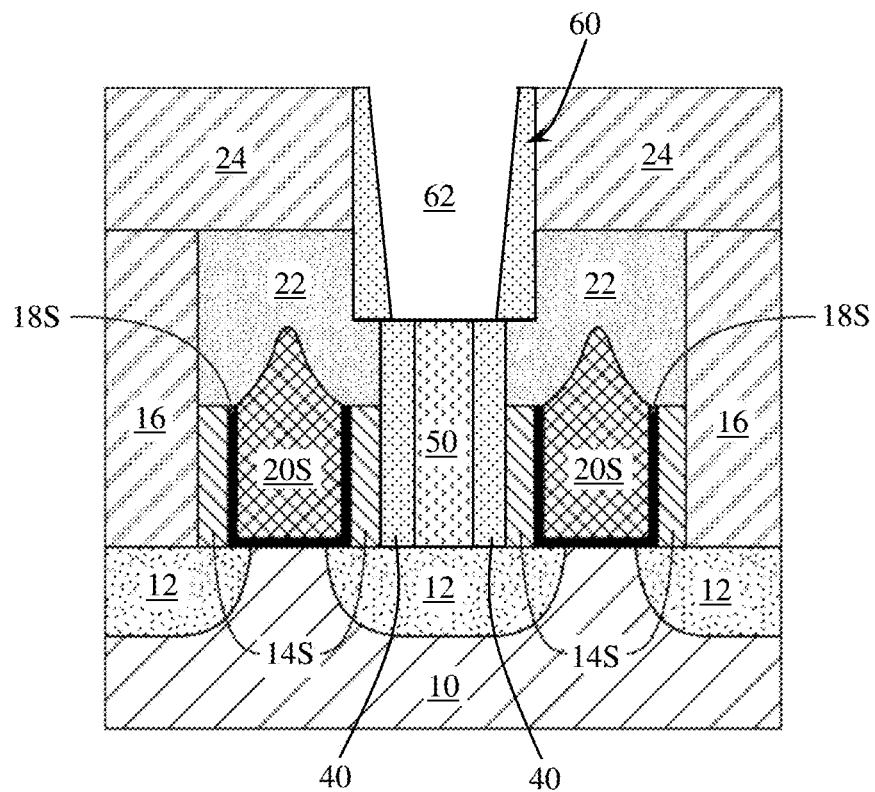
FIG. 14 is a cross sectional view of the exemplary semiconductor structure of FIG. 13 after forming an inverted-trapezoid opening in the sacrificial material located in the upper portion of the contact hole.

Referring now to FIG. 14, there is illustrated the exemplary semiconductor structure of FIG. 13 after forming an inverted-trapezoid opening 62 in the sacrificial material 60 located in the upper portion 36 of the contact hole 30. An etching process may be used for etching the sacrificial material 60 to form the inverted-trapezoid opening 62. The etching process may be performed utilizing one the etching processes mentioned above for forming the inverted-trapezoid opening 62.

Figure 15:
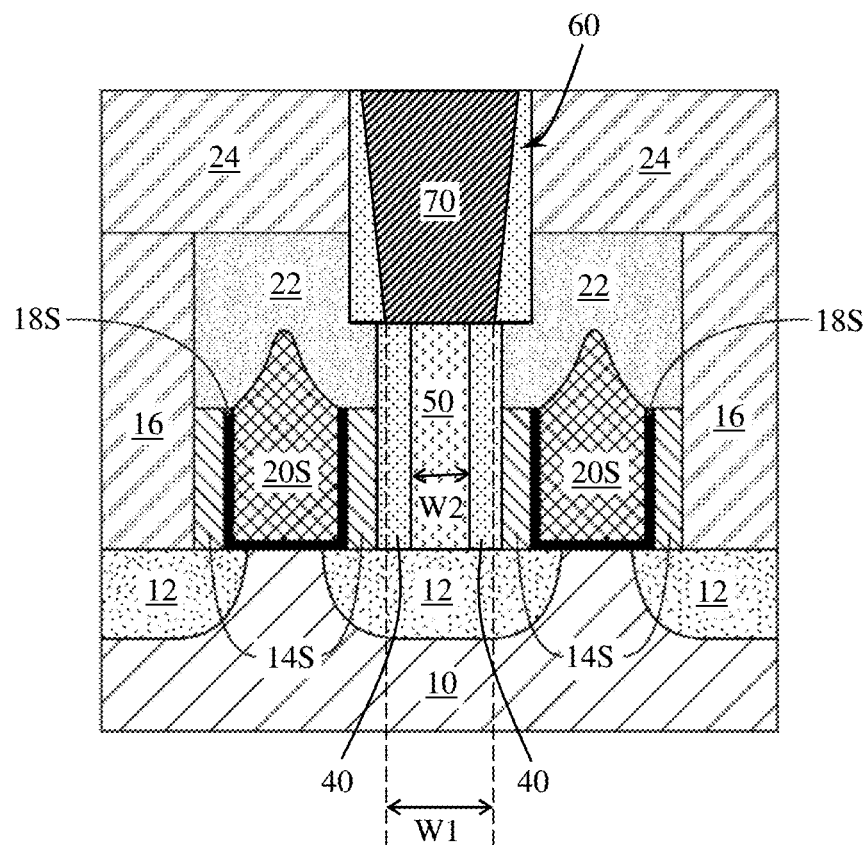
FIG. 15 is a cross sectional view of the exemplary semiconductor structure of FIG. 14 after forming a second conductor in the inverted-trapezoid opening.

Please refer to FIG. 1, at step S25, forming a second conductor in the contact hole and on the first conductor is performed. Referring now to FIG. 15, there is illustrated the exemplary semiconductor structure of FIG. 14 after forming a second conductor 70 in the inverted-trapezoid opening 62. Please refer to FIG. 1 and FIG. 15, in some embodiments of the present disclosure, a second conductor 70 is formed or deposited in the inverted-trapezoid opening 62 after forming the inverted-trapezoid opening 62 in the sacrificial material 60 located in the upper portion 36 of the contact hole 30. In some embodiments of the present disclosure, a material of the second conductor 70 is different from a material of the first conductor 50, but not limited thereto. The second conductor 70 is disposed above the first conductor 50. The deposition process may be performed utilizing one the deposition processes mentioned above for forming or depositing the second conductor 70 in the inverted-trapezoid opening 62 and above the first conductor 50. In some embodiments of the present disclosure, a width W2 of the second conductor 70 is greater than a width W1 of the first conductor 50. In some embodiments of the present disclosure, the second conductor 70 is a bit line (BL).

Figure 16:
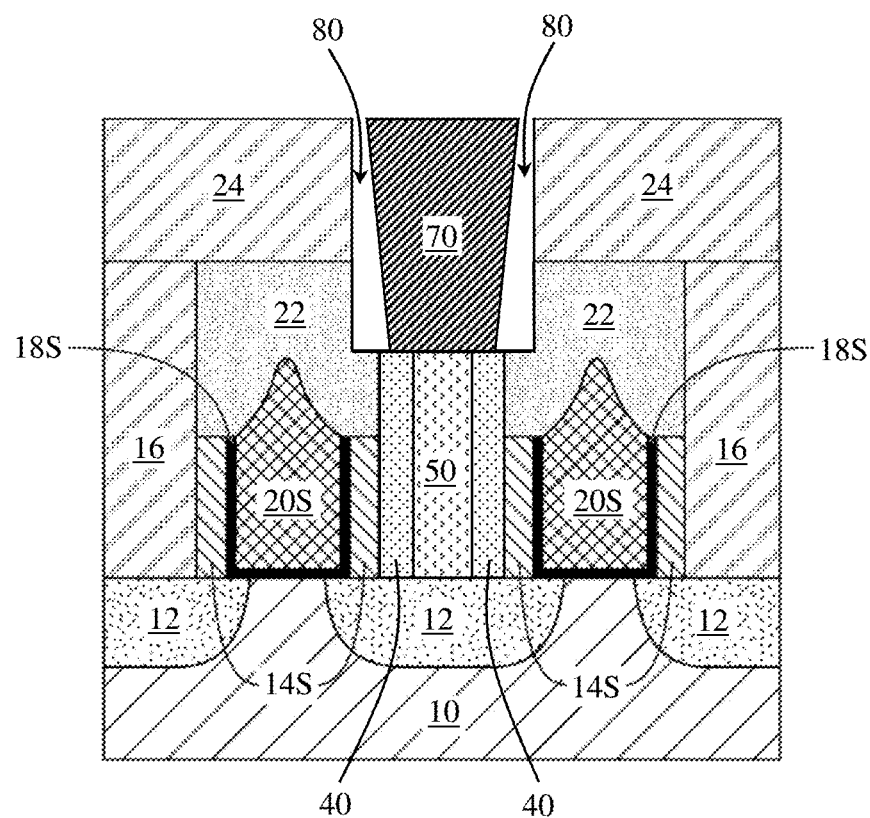
FIG. 16 is a cross sectional view of the exemplary semiconductor structure of FIG. 15 after removing the sacrificial material located in the upper portion of the contact hole and forming air gaps at two sides of the second conductor.

Referring now to FIG. 16, there is illustrated the exemplary semiconductor structure of FIG. 15 after removing the sacrificial material 60 located in the upper portion 36 of the contact hole 30 and forming air gaps 80 at two sides of the second conductor 70. An etching process may be used for etching the sacrificial material 60 to leave the second conductor 70. The etching process may be performed utilizing one the etching processes mentioned above for removing the sacrificial material 60 and leave the second conductor 70. Therefore, the semiconductor device, such as a transistor, with a self-aligned dielectric cap and two conductors (the first conductor 50 and the second conductor 70) is formed.

Figure 17:
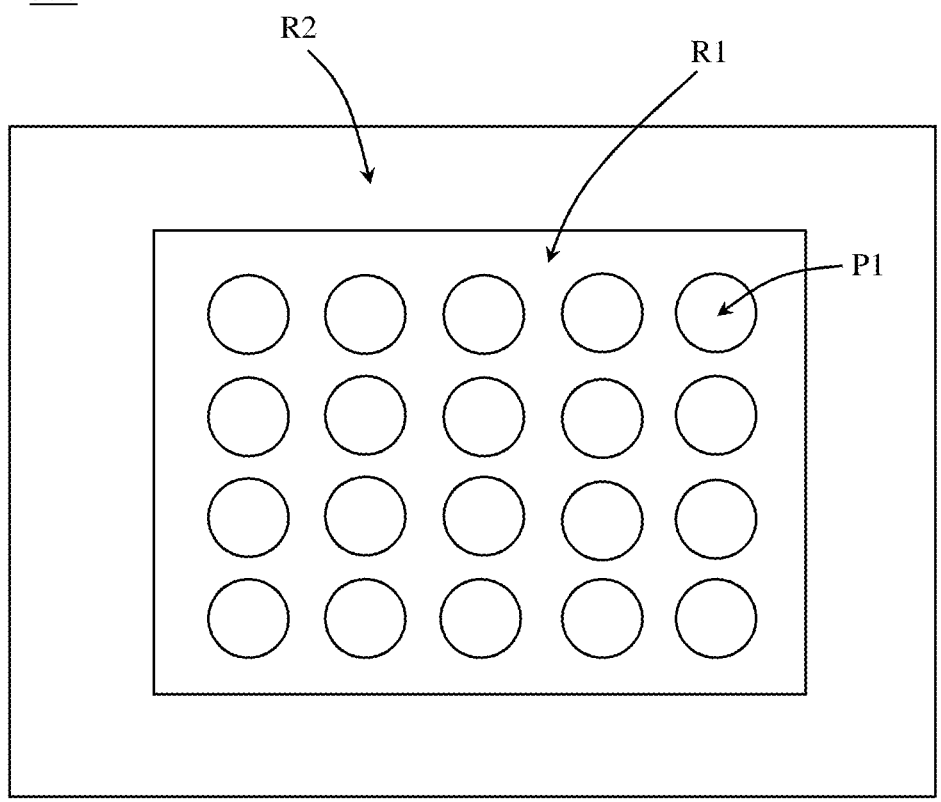
FIG. 17 is a top view of a memory cell.
Figure 18:
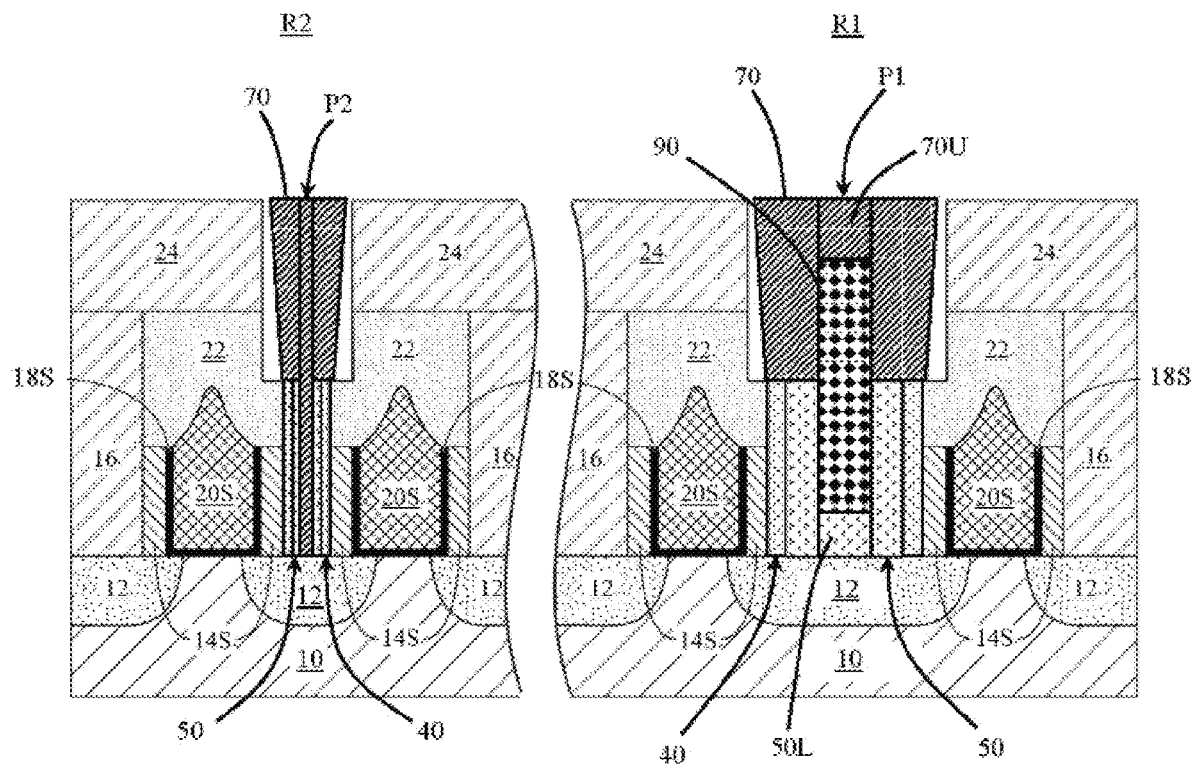
FIG. 18 is a cross sectional view of the exemplary semiconductor structure with a pattern-dense region and a pattern-loose region.
Figure 19:
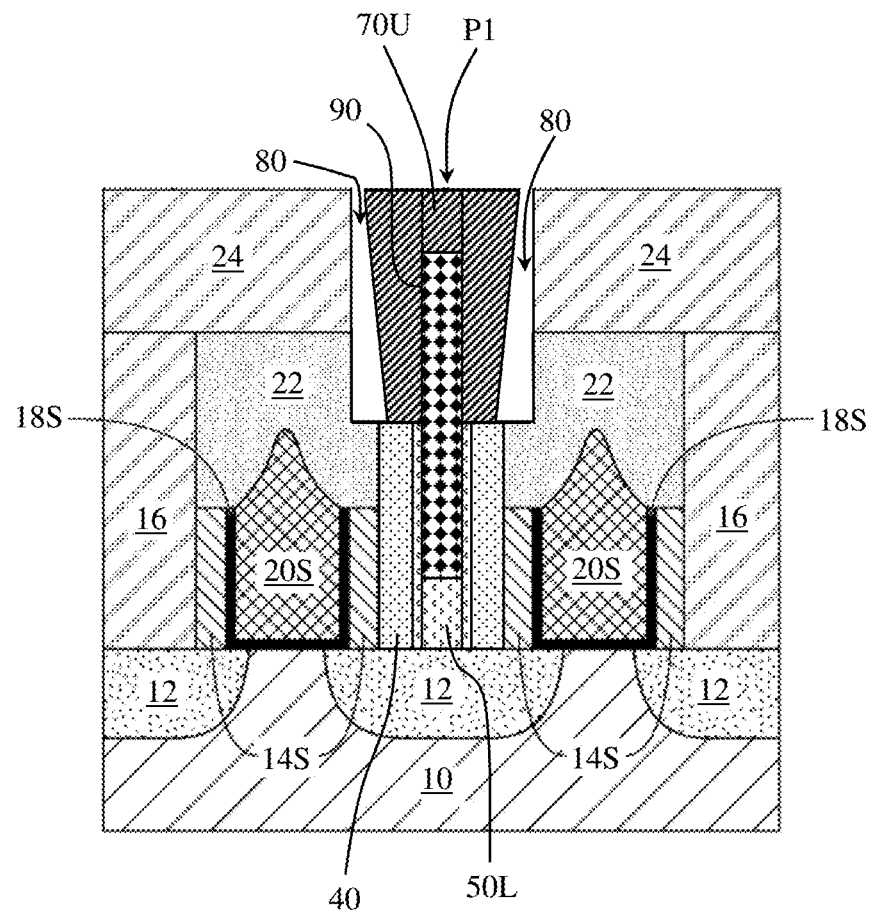
FIG. 19 is a cross sectional view of the exemplary semiconductor structure of FIG. 18 while a first plug is located in a pattern-dense region, wherein the first plug comprises a lower portion of the first conductor and an upper portion of the second conductor, and a landing pad between the lower portion and the upper portion.

FIG. 17 is a top view of a memory cell. FIG. 18 is a cross sectional view of the exemplary semiconductor structure with a pattern-dense region and a pattern-loose region. For a memory cell 300, such as a DRAM, there may be a pattern-dense region R1 and a pattern-loose region R2. Please refer to FIG. 19, there is illustrated the exemplary semiconductor structure of FIG. 18 while a first plug P1 is located in a pattern-dense region R1. In some embodiments of the present disclosure, a first plug P1 comprises a lower portion of the first conductor 50 and an upper portion of the second conductor 70, and a landing pad 90 between the lower portion and the upper portion. That is, the material of the second conductor 70 is different from the material of the first conductor 50.

Figure 20:
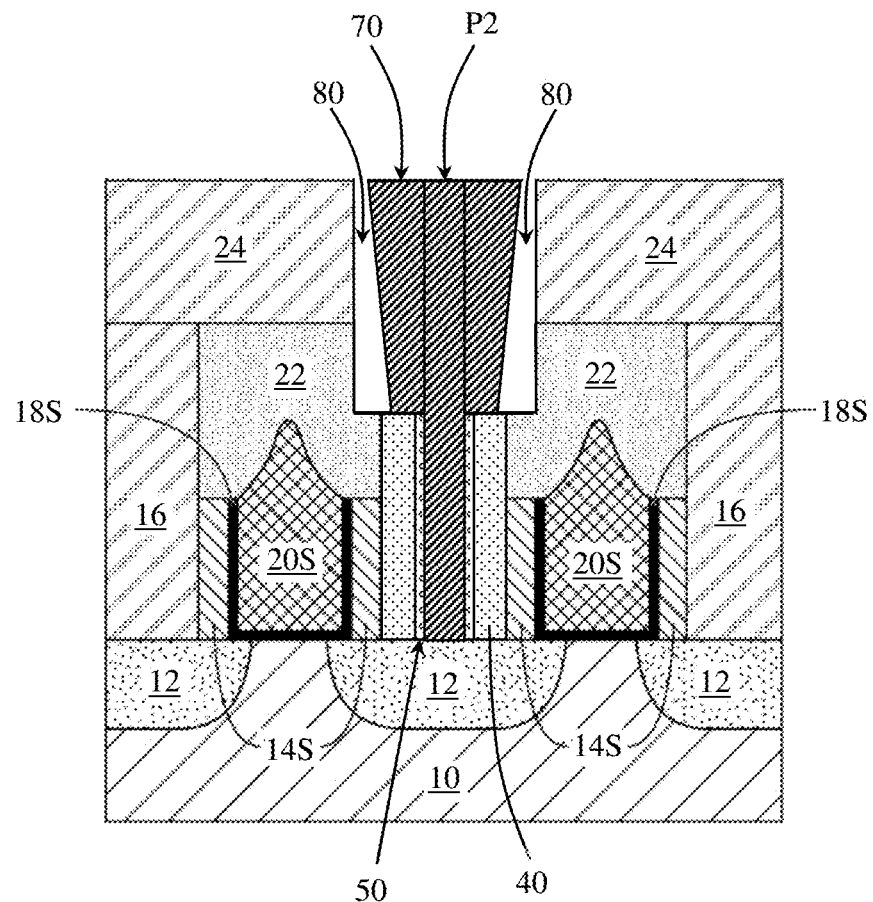
FIG. 20 is a cross sectional view of the exemplary semiconductor structure of FIG. 18 while a second plug is located in a pattern-loose region, wherein the second plug is made of the second conductor.

Please refer to FIG. 20, there is illustrated the exemplary semiconductor structure of FIG. 18 while a second plug is located in a pattern-loose region. In some embodiments of the present disclosure, a second plug P2 is made of the second conductor 70. That is, the material of the second conductor 70 is the same as the material of the first conductor 50.

Due to the design of the semiconductor device of the present disclosure, the first conductor 50 and the second conductor 70 are formed to prevent the erosion of the self-aligned dielectric cap corner. In addition, it may prevent source/drain contact which can lead to source/drain contact structure to conductive material shorts and dielectric breakdown (i.e., reliability) issues. A thick self-aligned dielectric cap 22 which may be kept by the first conductor 50 and the second conductor 70 (such as the first plug P1 formed in the pattern-dense region R1 or the second plug P2 formed in the pattern-loose region R2) also means deep conductive material recess, which reduces the conductive material volume and thus increases gate resistance.

One aspect of the present disclosure provides a semiconductor device including two gate structures located on a surface of a semiconductor material substrate; a first conductor between the two gate structures; a barrier disposed between the first conductor and the gate structure; a second conductor disposed on the first conductor; and a plurality of air gaps disposed at two sides of the second conductor; wherein a width of the second conductor is greater than a width of the first conductor.

Another aspect of the present disclosure provides a method for fabricating a semiconductor device including forming two gate structures on a surface of a semiconductor material substrate, wherein a dielectric spacer is located on a sidewall of each of the gate structures and a first interlayer dielectric (ILD) material laterally surrounds the dielectric spacer; recessing the dielectric spacer; etching a gate conductor material of each of the gate structure to provide a gate conductor structure having a middle portion that has a vertical thickness that is greater than a vertical thickness of each end portion; forming a self-aligned dielectric cap on the gate conductor structure, wherein the self-aligned dielectric cap has a middle portion that has a vertical thickness that is less than a vertical thickness of each end portion; forming a second interlayer dielectric (ILD) material over the first ILD material and the self-aligned dielectric cap; forming a contact hole into the first and second ILD materials that physically exposes one of the source/drain regions of each of the gate structure; forming a first conductor in the contact hole and between the two gates; and forming a second conductor in the contact hole and on the first conductor, wherein a width of the second conductor is greater than a width of the first conductor.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
   two gate structures located on a surface of a semiconductor material substrate;
   a first conductor between the two gate structures;
   a barrier disposed between the first conductor and one of the two gate structures;
   a second conductor disposed on the first conductor; and
   a plurality of air gaps disposed at two sides of the second conductor;
   wherein a width of the second conductor is greater than a width of the first conductor;
   wherein a first plug is located in a pattern-dense region, wherein the first plug comprises a lower portion of the first conductor and an upper portion of the second conductor, and a landing pad between the lower portion and the upper portion.

2. The semiconductor device of claim 1, wherein a second plug is located in a pattern-loose region, wherein the second plug is made of the second conductor.

3. The semiconductor device of claim 1, wherein the gate structure each comprises a gate conductor structure having a middle portion that has a vertical thickness that is greater than a vertical thickness of at least one end portion.

4. The semiconductor device of claim 3, further comprising a self-aligned dielectric cap located on the gate conductor structure, wherein the self-aligned dielectric cap includes a middle portion having a vertical thickness less than a vertical thickness of each end portion.

5. The semiconductor device of claim 4, wherein the gate structure further comprises a gate dielectric material layer located on a sidewall of the gate conductor structure and a bottommost surface of the gate conductor structure, wherein the gate dielectric material layer has a vertical thickness along the sidewall of the gate conductor structure that is less than a vertical thickness of the middle portion of the gate conductor structure.

6. The semiconductor device of claim 5, wherein at least one end portion of the self-aligned dielectric cap extends onto a topmost surface of the gate dielectric material layer and a topmost surface of a dielectric spacer that is located on a sidewall of the gate dielectric material layer.

7. The semiconductor device of claim 6, wherein the vertical thickness of the gate dielectric material layer is the same as a vertical thickness of the dielectric spacer.

8. The semiconductor device of claim 7, wherein the vertical thickness of the gate dielectric material layer and the vertical thickness of the dielectric spacer are the same as the vertical thickness of an outermost edge of at least one end portion of the gate conductor structure.

9. The semiconductor device of claim 4, further comprising a first interlayer dielectric (ILD) material laterally surrounding the functional gate structure, and a second interlayer dielectric (ILD) material located on the first ILD material and on the self-aligned dielectric cap.

10. The semiconductor device of claim 1, wherein the first conductor is a bit line contact, and the second conductor is a bit line.

11. The semiconductor device of claim 1, wherein the semiconductor material substrate is a bulk semiconductor substrate, a topmost semiconductor material layer of a semiconductor-on-insulator, a semiconductor fin or a semiconductor nanowire.

12. A method of forming a semiconductor device, the method comprising:
    forming two gate structures including a gate conductor material on a surface of a semiconductor material substrate, a dielectric spacer on sidewalls of the two gate structures and a first interlayer dielectric (ILD) material laterally surrounding the dielectric spacer;
    recessing the dielectric spacer;
    etching the gate conductor material to form a gate conductor structure having a middle portion that has a vertical thickness that is greater than a vertical thickness of each end portion;
    forming a self-aligned dielectric cap on the gate conductor structure, wherein the self-aligned dielectric cap has a middle portion that has a vertical thickness that is less than a vertical thickness of each end portion;
    forming a second interlayer dielectric (ILD) material over the first ILD material and the self-aligned dielectric cap;
    forming a contact hole penetrating through the first and second ILD materials to physically exposes a source/drain region in the semiconductor material substrate;
    forming a first conductor in the contact opening and between the two gate structures; and
    forming a second conductor in the contact opening and on the first conductor, wherein a width of the second conductor is greater than a width of the first conductor.

13. The method for fabricating the semiconductor device of claim 12, wherein the step of forming the contact hole to penetrating through the first and second ILD materials that physically exposes one of the source/drain regions of the gate structure further comprises: forming a lower portion between the two gate structures and contacted the dielectric spacer and the self-aligned dielectric cap, and forming an upper portion on the lower portion, between the two gate structures and contacted the self-aligned dielectric cap and the second ILD material.

14. The method for fabricating the semiconductor device of claim 12, further comprising forming a barrier between the first conductor and one of the two gate structures after forming the first conductor in the contact hole and between the two gate structures.

15. The method for fabricating the semiconductor device of claim 14, further comprising forming a plurality of air gaps at two sides of the second conductor after forming the second conductor in the contact hole and on the first conductor.

16. The method for fabricating the semiconductor device of claim 12, wherein the first conductor is a bit line contact.

17. The method for fabricating the semiconductor device of claim 12, wherein the second conductor is a bit line.

18. The method for fabricating the semiconductor device of claim 12, wherein the step of forming two gate structures on the surface of the semiconductor material substrate further comprises: forming a gate dielectric material layer on a sidewall of the gate conductor structure and a bottommost surface of the gate conductor structure, wherein the gate dielectric material layer has a vertical thickness along the sidewall of the gate conductor structure that is less than a vertical thickness of the middle portion of the gate conductor structure, and the gate conductor material and the gate dielectric material layer are formed the gate structure.

19. The method for fabricating the semiconductor device of claim 12, wherein the step of forming the self-aligned dielectric cap on the gate conductor structure further comprises: forming a concavely right angle at an upper portion of one of the end portions of the self-aligned dielectric cap, wherein at least one end portion of the self-aligned dielectric cap extends onto a topmost surface of the gate dielectric material layer and a topmost surface of a dielectric spacer that is located on a sidewall of the gate dielectric material layer.

* * * * *